United States Patent
Lym et al.

(10) Patent No.: US 11,056,153 B2
(45) Date of Patent: Jul. 6, 2021

(54) MEMORY MODULE INCLUDING BATTERY

(71) Applicant: SK hynix Inc., Icheon-si (KR)

(72) Inventors: Sang Kug Lym, Seoul (KR); Jong Bum Park, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/560,762

(22) Filed: Sep. 4, 2019

(65) Prior Publication Data

US 2019/0392870 A1    Dec. 26, 2019

Related U.S. Application Data

(63) Continuation of application No. 15/996,001, filed on Jun. 1, 2018, now Pat. No. 10,446,194, which is a continuation of application No. 14/918,734, filed on Oct. 21, 2015, now Pat. No. 10,014,032.

(30) Foreign Application Priority Data

May 6, 2015 (KR) .......................... 10-2015-0062961

(51) Int. Cl.
*G11C 5/14* (2006.01)
*G11C 5/04* (2006.01)
*H05K 7/20* (2006.01)
*H05K 1/02* (2006.01)

(52) U.S. Cl.
CPC ................ *G11C 5/141* (2013.01); *G11C 5/04* (2013.01); *H05K 1/0203* (2013.01); *H05K 7/20509* (2013.01)

(58) Field of Classification Search
CPC .......... H05K 1/02–0203; H05K 1/0209–0212; H05K 7/20509; H05K 7/2039; H05K 7/20545; H05K 7/20445; H05K 7/209; H05K 7/20454; H05K 2201/066; H01L 23/3672; G11C 5/141; G11C 5/04
USPC .... 361/708–715, 719–723, 679.32; 257/706; 57/717; 174/252
See application file for complete search history.

(56) References Cited

U.S. PATENT DOCUMENTS

| | | | | |
|---|---|---|---|---|
| 4,965,828 A | * | 10/1990 | Ergott, Jr. ........... | G06F 11/1441 307/64 |
| 5,189,598 A | | 2/1993 | Bolan et al. | |
| 5,297,099 A | * | 3/1994 | Bolan ................... | G11C 5/141 365/149 |
| 5,708,287 A | | 1/1998 | Nakagawa et al. | |
| 5,708,297 A | | 1/1998 | Clayton | |

(Continued)

OTHER PUBLICATIONS

Micron Technologies, 288-Pin DDR4 Nonvolatile RDIMM Features, "DDR4 SDRAM NVRDIMM", Apr. 9, 2010, pp. 1-25, Micron Technology Inc.

*Primary Examiner* — Zachary Pape
*Assistant Examiner* — Amir A Jalali
(74) *Attorney, Agent, or Firm* — William Park & Associates Ltd.

(57) ABSTRACT

A memory module may include a module substrate having first and second surfaces facing away from each other, a plurality of first memories mounted over one or more of the first and second surfaces, one or more second memories and a controller each mounted over one of the first and second surfaces of the module substrate, and a plurality of batteries mounted over one or more of the first and second surfaces of the module substrate.

23 Claims, 5 Drawing Sheets

(56) References Cited

U.S. PATENT DOCUMENTS

| | | | |
|---|---|---|---|
| 5,835,733 A * | 11/1998 | Walsh | G06F 13/28 |
| | | | 710/303 |
| 6,201,695 B1 * | 3/2001 | Duesman | H01L 23/3672 |
| | | | 174/16.3 |
| 6,469,474 B2 | 10/2002 | Bunker | |
| 7,724,604 B2 | 5/2010 | Amidi et al. | |
| 8,018,723 B1 * | 9/2011 | Yu | H01L 23/367 |
| | | | 257/707 |
| 8,118,483 B2 | 2/2012 | Cox | |
| 8,154,258 B2 | 4/2012 | Pappas et al. | |
| 8,270,226 B2 | 9/2012 | Choi et al. | |
| 8,583,869 B2 | 11/2013 | Hinkle et al. | |
| 8,725,946 B2 | 5/2014 | Petersen et al. | |
| 8,885,334 B1 * | 11/2014 | Baxter | G06F 13/1684 |
| | | | 361/679.32 |
| 8,897,091 B1 * | 11/2014 | Burstein | G11C 29/028 |
| | | | 365/226 |
| 8,930,647 B1 * | 1/2015 | Smith | G06F 3/0661 |
| | | | 711/154 |
| 9,348,539 B1 * | 5/2016 | Saxena | G11C 5/04 |
| 9,529,543 B1 * | 12/2016 | Chinnakkonda Vidyapoornachary | G11C 5/04 |
| 2002/0006032 A1 * | 1/2002 | Karabatsos | G11C 5/04 |
| | | | 361/760 |
| 2002/0056018 A1 * | 5/2002 | Schumacher | G06F 13/4086 |
| | | | 710/300 |
| 2003/0089978 A1 | 5/2003 | Miyamoto et al. | |
| 2003/0090879 A1 | 5/2003 | Doblar et al. | |
| 2006/0198238 A1 | 9/2006 | Partridge et al. | |
| 2007/0211426 A1 * | 9/2007 | Clayton | H01L 23/473 |
| | | | 361/689 |
| 2007/0212920 A1 * | 9/2007 | Clayton | H01R 12/721 |
| | | | 439/326 |
| 2008/0123300 A1 | 5/2008 | Tian et al. | |
| 2010/0005212 A1 * | 1/2010 | Gower | G06F 13/4234 |
| | | | 710/308 |
| 2010/0008175 A1 * | 1/2010 | Sweere | G06F 12/0866 |
| | | | 365/229 |
| 2010/0027220 A1 * | 2/2010 | Hughes | H05K 7/20445 |
| | | | 361/702 |
| 2010/0095048 A1 * | 4/2010 | Bechtolsheim | G06F 11/1441 |
| | | | 711/103 |
| 2010/0146333 A1 | 6/2010 | Yong et al. | |
| 2011/0053391 A1 * | 3/2011 | Vrenna | H01R 12/721 |
| | | | 439/78 |
| 2011/0153903 A1 * | 6/2011 | Hinkle | G06F 13/20 |
| | | | 710/313 |
| 2011/0320690 A1 * | 12/2011 | Petersen | G06F 3/0611 |
| | | | 711/103 |
| 2012/0062187 A1 | 3/2012 | Shim | |
| 2013/0086309 A1 | 4/2013 | Lee et al. | |
| 2013/0186595 A1 * | 7/2013 | Hsieh | H01L 23/4093 |
| | | | 165/80.2 |
| 2013/0262956 A1 * | 10/2013 | Haywood | G11C 7/1006 |
| | | | 714/758 |
| 2014/0022733 A1 | 1/2014 | Lim et al. | |
| 2014/0032984 A1 * | 1/2014 | Lee | G11C 29/08 |
| | | | 714/718 |
| 2014/0098480 A1 * | 4/2014 | Foster, Sr. | G06F 1/185 |
| | | | 361/679.31 |
| 2014/0146461 A1 | 5/2014 | Choi et al. | |
| 2015/0181746 A1 * | 6/2015 | Mullen | G06F 1/183 |
| | | | 361/679.31 |
| 2015/0261265 A1 * | 9/2015 | Dean | G06F 1/20 |
| | | | 361/679.31 |
| 2015/0261446 A1 | 9/2015 | Lee | |
| 2015/0279463 A1 | 10/2015 | Berke | |
| 2015/0310898 A1 * | 10/2015 | Takefman | G11C 7/1066 |
| | | | 711/105 |
| 2015/0378808 A1 | 12/2015 | Kumar et al. | |
| 2016/0065000 A1 * | 3/2016 | Maeda | H02J 9/061 |
| | | | 307/23 |
| 2016/0254031 A1 | 9/2016 | Noguchi et al. | |
| 2016/0342487 A1 | 11/2016 | Ware et al. | |
| 2017/0060706 A1 * | 3/2017 | Kinoshita | G06F 11/1666 |
| 2017/0286285 A1 | 10/2017 | Berke et al. | |
| 2020/0335140 A1 * | 10/2020 | Kwon | G11C 5/04 |

* cited by examiner

MEMORY MODULE INCLUDING BATTERY

CROSS-REFERENCE TO RELATED APPLICATION

The present application is a continuation application of U.S. patent application Ser. No. 15/996,001, filed on Jun. 1, 2018, which is a continuation application of U.S. patent application Ser. No. 14/918,734, filed on Oct. 21, 2015, and claims priority under 35 U.S.C. § 119(a) to Korean Patent Application No. 10-2015-0062961 filed on May 6, 2015, in the Korean Intellectual Property Office, which is incorporated herein by reference in its entirety.

BACKGROUND

1. Technical Field

Various embodiments generally relate to a memory module, and more particularly to a memory module having batteries.

2. Related Art

A computer system (e.g., server computer system and client computer system) may include a CPU, memory modules, and other electronic components (e.g., hard disks, graphic devices, passive elements, and power supply devices). The memory module is an electronic component that includes one or more semiconductor memory chips mounted on a printed circuit board. Examples of the memory module include a DRAM Dual In-line Memory Module (hereinafter referred to as "DIMM") in which a plurality of DRAMs and a plurality of memory controllers for controlling the operations of the DRAMs are mounted on a printed circuit board having signal lines for data transmission between the memory controllers and the DRAMs.

A Non-Volatile Dual In-line Memory Module (hereinafter referred to as "NVDIMM") is a DIMM that retains data even in the absence of power supply. Examples of the NVDIMMs may include an NVDIMM that is built with both DRAMs and Flash Memories. This type of NVDIMM may be used in a server computer system to enable its system memory to be persistent in the event of power failure.

The NVDIMM may include volatile memories (e.g., DRAMs) and nonvolatile memories (e.g., NAND Flash Memories) mounted together with an NVDIMM controller on a printed circuit board. Under normal power conditions, the NVDIMM operates like a regular DRAM module. It differs from a regular module, however, because it transfers data between the DRAMs and Flash Memories to save data from the DRAM to the Flash Memories and restore the date from the Flash Memories to the DRAM.

A server computer system including the NVDIMM may also include batteries mounted on a main system board. In the case of power failure, the NVDIMM operates using the batteries, the super capacitor of which stores power during a normal state.

While not shown, such batteries mounted on the main system board of the server computer system may have one or more types of an HDD type A, a PCI card type B, and a custom type C.

SUMMARY

In an embodiment, a memory module may be provided. The memory module may include a module substrate of a rectangular plate-shape having one surface and the other surface which faces away from the one surface. The memory module may include a plurality of first memories mounted to at least any one surface of the one surface and the other surface of the module substrate. The memory module may include a second memory and a controller mounted to any one surface of the one surface and the other surface of the module substrate. The memory module may include a plurality of batteries mounted to at least any one surface of the one surface and the other surface of the module substrate.

DETAILED DESCRIPTION

Figure 1:
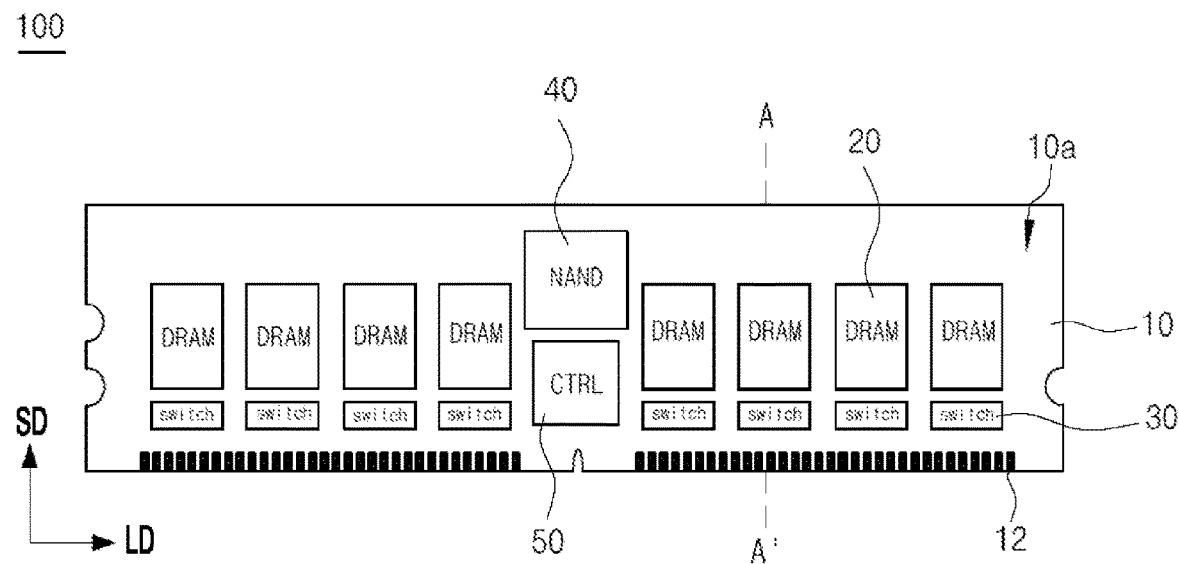
FIGS. 1 and 2 are examples of a front view and a rear view illustrating a memory module in accordance with an embodiment.
Figure 2:
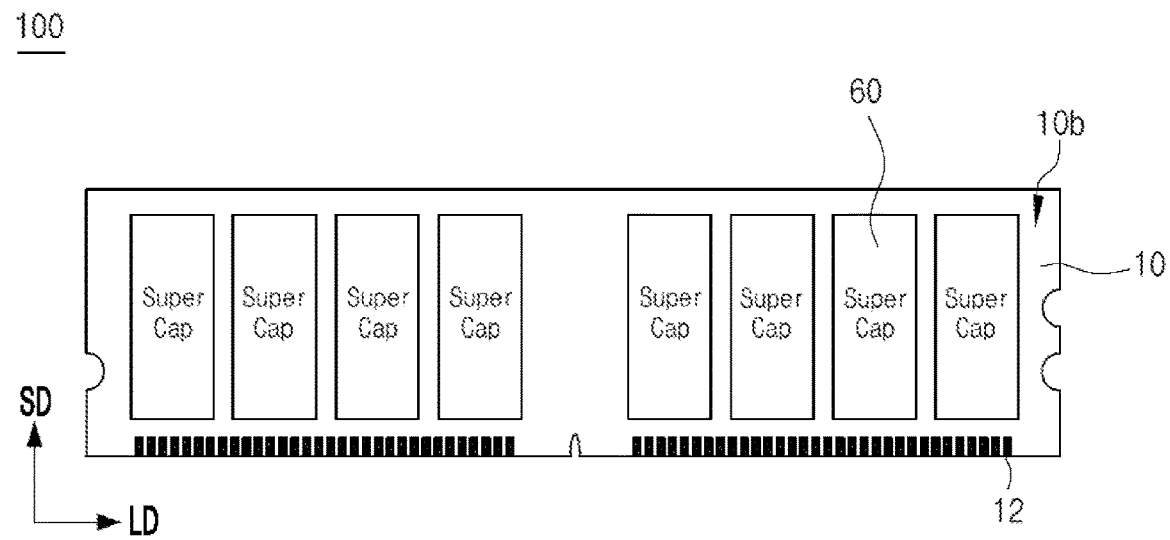
Figure 3:
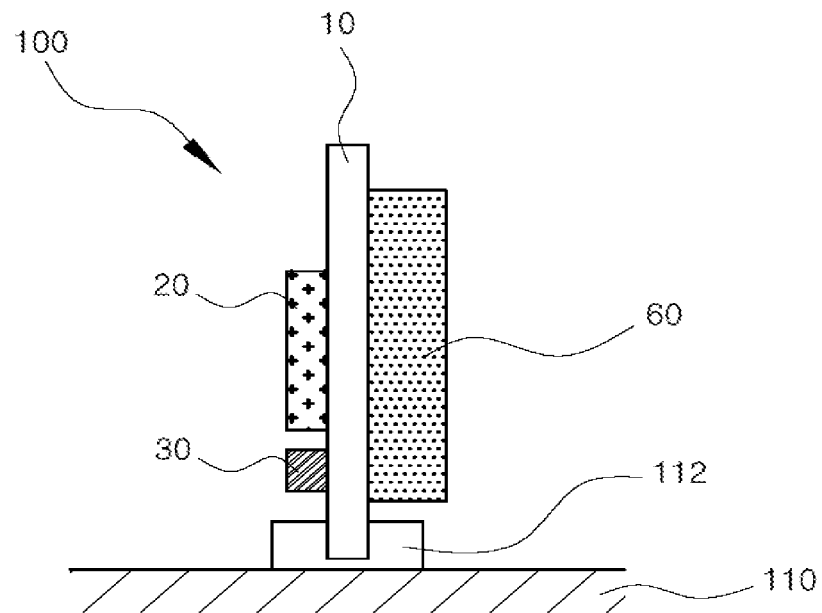
FIGS. 3 and 4 are examples of cross-sectional views taken along the line A-A' of FIG. 1, illustrating how the memory module may be mounted on a main system board in accordance with an embodiment.

Hereinafter, a memory module including batteries will be described below with reference to the accompanying drawings through various examples of embodiments.

Referring to FIGS. 1 to 4, a memory module 100 in accordance with an embodiment may be mounted over a main system board 110. Here, the memory module 100 may be an NVDIMM of a server computer system. The memory module 100 may include a module substrate 10, a plurality of first memories 20, switches 30, a second memory 40, a controller 50, and batteries 60.

The module substrate 10 may be a rectangular-shaped substrate that has first and second surfaces 10a and 10b facing away from each other. The module substrate 10 may have short sides along a first direction SD and long sides along a second direction LD. The module substrate 10 may include a plurality of electrode pads 12 arranged on both sides of the module substrate 10 along an edge in the second direction LD. The plurality of electrode pads 12 may fit into a socket 112 of the main system board 110 to electrically connect the module substrate 10 to the main system board 110. The module substrate 10 may have circuit patterns that are formed on the first and second surfaces 10a and 10b and vias that are formed inside the module substrate 10 for electrically connecting the circuit patterns on the first and second surfaces 10a and 10b.

The first memories 20 may include volatile memories. For instance, the first memories 20 may include DRAMs. The first memories 20 may be mounted at a predetermined interval along the second direction LD. In an embodiment, the first memories 20 are mounted on certain portions of the first surface 10a other than a center portion thereof. For example, DRAMs may be mounted on the first surface 10a of the module substrate 10 along the second direction LD such that eight DRAMs are symmetrically arranged on both sides of the center portion of the module substrate 10 at predetermined intervals.

The switches 30 may turn on/off the first memories 20 in response to control signals provided from the controller 50. The switches 30 may be mounted over the first surface 10a of the module substrate 10 such that the switches 30 are spaced predetermined distances apart from the first memories 20. The switches 30 may have a similar structure to known switches, and therefore detailed illustration and description thereof will be omitted herein.

The second memory 40 may include one or more non-volatile memories to allow the memory module 100 to retain data even in the absence of power supply. For instance, the memory module 100 may include, as the second memory 40, a NAND Flash memory mounted over the center portion of the first surface 10a. The second memory 40 may operate in response to a control signal provided from the controller 50 in the event of power failure.

The controller 50 may include an NVDIMM controller. The controller 50 may be mounted over the first surface 10a of the module substrate 10. In an embodiment, the controller 50 may be positioned at the center portion of the module substrate 10 when viewed in the second direction LD. In an embodiment, the controller 50 may be spaced apart from the second memory 40. The controller 50 may provide control signals that turn on/off the switches 30 and enable the data transmission between the first memories 20 and the second memory 40.

The batteries 60 may have a super capacitor structure to supply power to the memory module 100 in the event of power failure. The batteries 60 having the super capacitor structure may be mounted over the second surface 10b of the module substrate 10. For example, the batteries 60 having the super capacitor structure may be respectively mounted over certain portions of the second surface 10b of the module substrate 10 facing away from the portions of the first surface 10a of the module substrate 10 on which the first memories 20 and the switches 30 are mounted.

Since batteries having the super capacitor structure are sensitive to heat, the batteries 60, which are mounted on a surface facing away from the first and second memories 20 and 40, may not operate properly due to the heat generated while the first memories 20 and the second memory 40 are operating.

Figure 4:
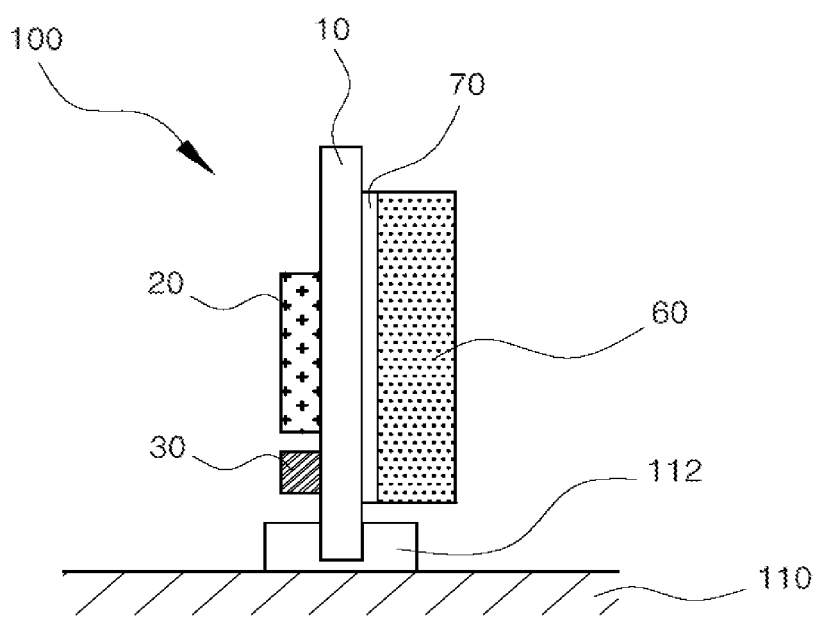

Therefore, as shown in FIG. 4, insulation members 70 may be interposed between the second surface 10b of the module substrate 10 and the batteries 60. The insulation members 70 may include one or more of separate insulation plates and insulation layers formed on the second surface 10b of the module substrate 10.

As described above, the memory module 100 in accordance with an embodiment may include the first memories 20, the switches 30, the second memory 40, and the controller 50 mounted on the first surface 10a of the module substrate 10, and the plurality of batteries 60 mounted on the second surface 10b of the module substrate 10.

Since the memory module 100 in accordance with an embodiment includes batteries 60 with super capacitor structure to sustain power to volatile memories in an NVDIMM, it is not necessary for a server computer system to have batteries for the NVDIMM on the main system board 110, and thus even when a number of NVDIMMs are mounted on the main system board, it is possible to efficiently utilize the space of the main system board 110.

Also, even if a server computer system has two or more NVDIMMs on its main system board, no additional batteries are required to be mounted on the main system board 110 because the memory module 100 has their own batteries 60 with super capacitor structure.

In addition, since the memory module 100 has the batteries 60 with super capacitor structure on the opposite surface of the surface where the first memories 20, the switches 30, the second memory 40, and the controller 50 are mounted, an increase in volume of the memory module 100 may be minimized, and the memory module 100 may be attached to existing sockets of the main system board 110 without increasing spaces.

Figure 5:
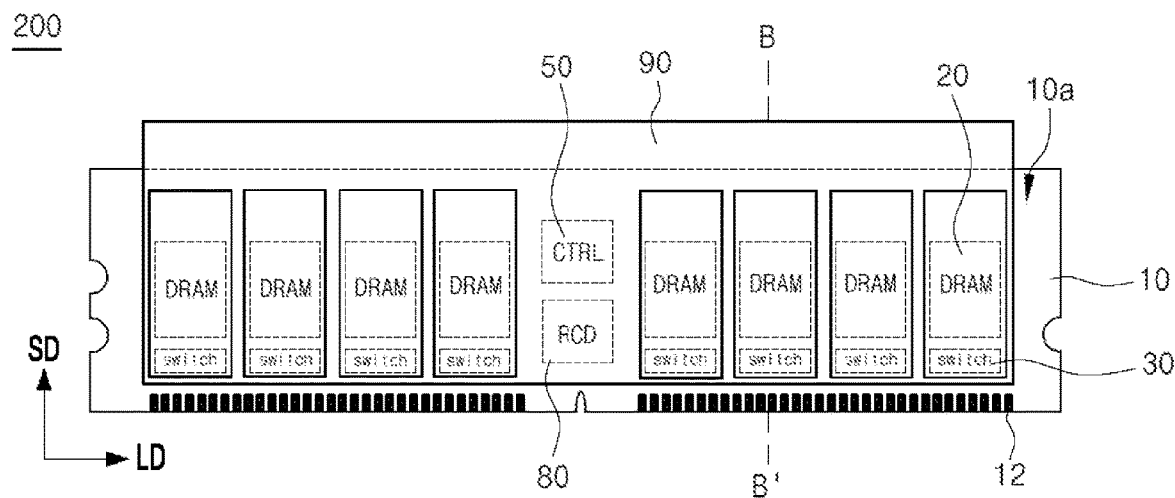
FIGS. 5 and 6 are examples of a front view and a rear view illustrating a memory module in accordance with an embodiment.
Figure 6:
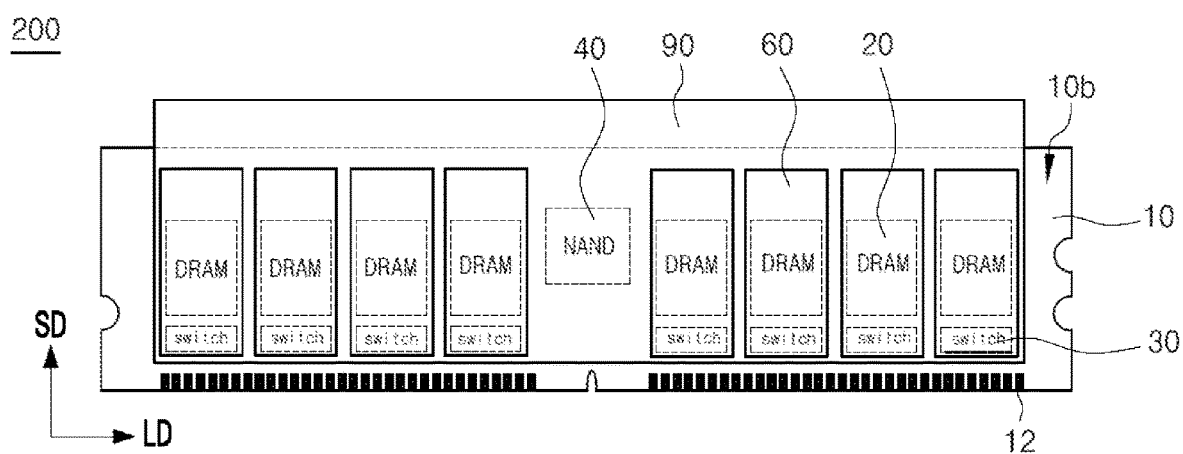
Figure 7:
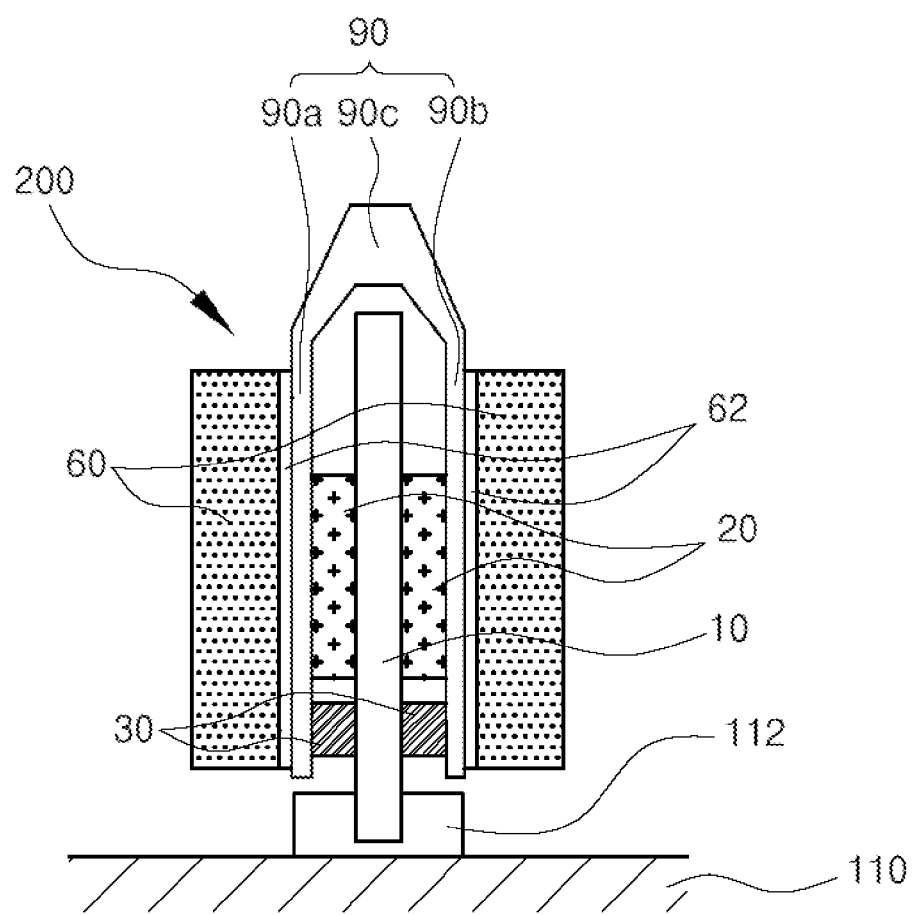
FIG. 7 is an example of a cross-sectional view taken along the line B-B' of FIG. 5, illustrating how the memory module may be mounted on a main system board in accordance with an embodiment.

Referring to FIGS. 5 to 7, a memory module 200 in accordance with an embodiment may have a relatively high capacity when compared to the aforementioned embodiment.

The memory module 200 having the high capacity NVDIMM structure may include a module substrate 10, first memories 20, switches 30, a second memory 40, a controller 50, batteries 60, and a heat sink 90. The memory module 200 in accordance with an embodiment may further include a register clock driver (hereinafter referred to as "RCD") 80.

The module substrate 10 may be a rectangular-shaped substrate that has first and second surfaces 10a and 10b facing away from each other. The module substrate 10 may have short sides along a first direction SD and long sides along a second direction LD. The module substrate 10 may include circuit patterns (not shown) on the first surface 10a and the second surface 10b thereof, and vias (not shown) formed inside the module substrate 10. The module substrate 10 may include a plurality of electrode pads 12 arranged on both sides of the module substrate 10 along an edge in the second direction LD. The plurality of electrode pads 12 may fit into a socket 112 of the main system board 110.

The first memories 20 may include volatile memory devices such as DRAMs. The first memories 20 are mounted over the first and second surfaces 10a and 10b of the module substrate 10. The first memories 20 may be arranged at a predetermined interval along the second direction LD. In an embodiment, the first memories 20 are arranged on certain portions of the first and second surfaces 10a and 10b other than center portions thereof. In an embodiment, the first memories 20 may be symmetrically mounted on the first and second surfaces 10a and 10b of the module substrate 10 along the second direction LD such that eight DRAMs are symmetrically arranged on both sides of the center portions of the first and second surfaces 10a and 10b at predetermined intervals.

The switches 30 may turn on/off the first memories 20. The switches 30 may be mounted over one or more of the first and second surfaces 10a and 10b of the module substrate 10 such that the switches 30 are spaced predetermined distances apart from the first memories 20.

The second memory 40 may include one or more non-volatile memories such as Flash Memories. In an embodiment, the second memory 40 may be mounted over any one of the first and second surfaces 10a and 10b of the module substrate 10. For example, the second memory 40 may be mounted over the center portion of the second surface 10b. The second memory 40 may retain data even in the absence of power supply, and thus the first memories 20 transfer data stored therein to the second memory 40 to save data and restore the date from the second memory 40 to the first memories 20 after having recovered from a power outage.

The controller 50 may include an NVDIMM controller. The controller 50 may be mounted over the first surface 10a or the second surface 10b of the module substrate 10 at the center portion of the module substrate 10 where the second memory 40 is not mounted. The controller 50 may provide control signals to the second memory 40 to enable the data transmission between the first memories 20 and the second memory 40. Here, the first memories 20 may include DRAMs, and the second memory 40 may include a Flash Memory.

The RCD 80 may be mounted over the first surface 10a of the module substrate 10. In an embodiment, the RCD 80 may be positioned at the center portion of the first surface 10a when viewed in the second direction LD. The RCD 80 may be spaced apart from the controller 50. The RCD 80 may be similar to that of known memory module, and thus detailed description thereof will be omitted herein.

The heat sink 90 may be disposed on the first and second surfaces 10a and 10b of the module substrate 10 on which the first and second memories 20 and 40, the switches 30, the controller 50 and the RCD 80 are mounted. In an embodiment, the heat sink 90 may include a front surface portion 90a disposed on an edge portion of the first surface 10a, a rear surface portion 90b disposed on an edge portion of the second surface 10b, and a connection portion 90c, which is disposed on the opposite edge to the edge where the electrode pads are arranged and connects the front surface portion 90a and the rear surface portion 90b to each other. In an embodiment, the heat sink 90 may be formed by combining the front surface portion 90a, the rear surface portion 90b, and the connection portion 90c. In another embodiment, the heat sink 90 may be an integrated structure that has the front surface portion 90a, the rear surface portion 90b, and the connection portion 90c therein. The heat sink 90 may be installed in such a way as to be brought into contact with the first and second memories 20 and 40. As a result, the heat generated while the first and second memories 20 and 40 are driven may be dissipated through the heat sink 90.

The batteries 60 may have a super capacitor structure to supply power to the memory module 200 in the event of power failure. The batteries 60 may be mounted over certain portions of the heat sink 90 disposed on the first memories 20, which are disposed on both the first and second surfaces 10a and 10b of the module substrate 10. In an embodiment, the batteries 60 may be mounted over thermal interface materials 62 formed on the heat sink 90.

In an embodiment, since the first memories 20 (e.g., DRAMs) are mounted over both the first and second surfaces 10a and 10b of the module substrate 10, memory module 200 (e.g., NVDIMM) may have a relatively high capacity when compared to the aforementioned embodiment. Also, the heat sink 90 is additionally mounted over the first and second surfaces 10a and 10b of the module substrate 10, and thus the chances of an error occurring due to heat generation may decrease.

In addition, since the memory module 200 in accordance with an embodiment include a plurality of batteries having a super capacitor structure to sustain power to volatile memories in the memory module 200, no additional batteries are required to be mounted over the main system board because each memory module 200 has their own batteries 60 with super capacitor structure, and thus it is possible to efficiently utilize the space of the main system board.

The memory modules in accordance with various embodiments may be applied to various kinds of electronic systems.

Figure 8:
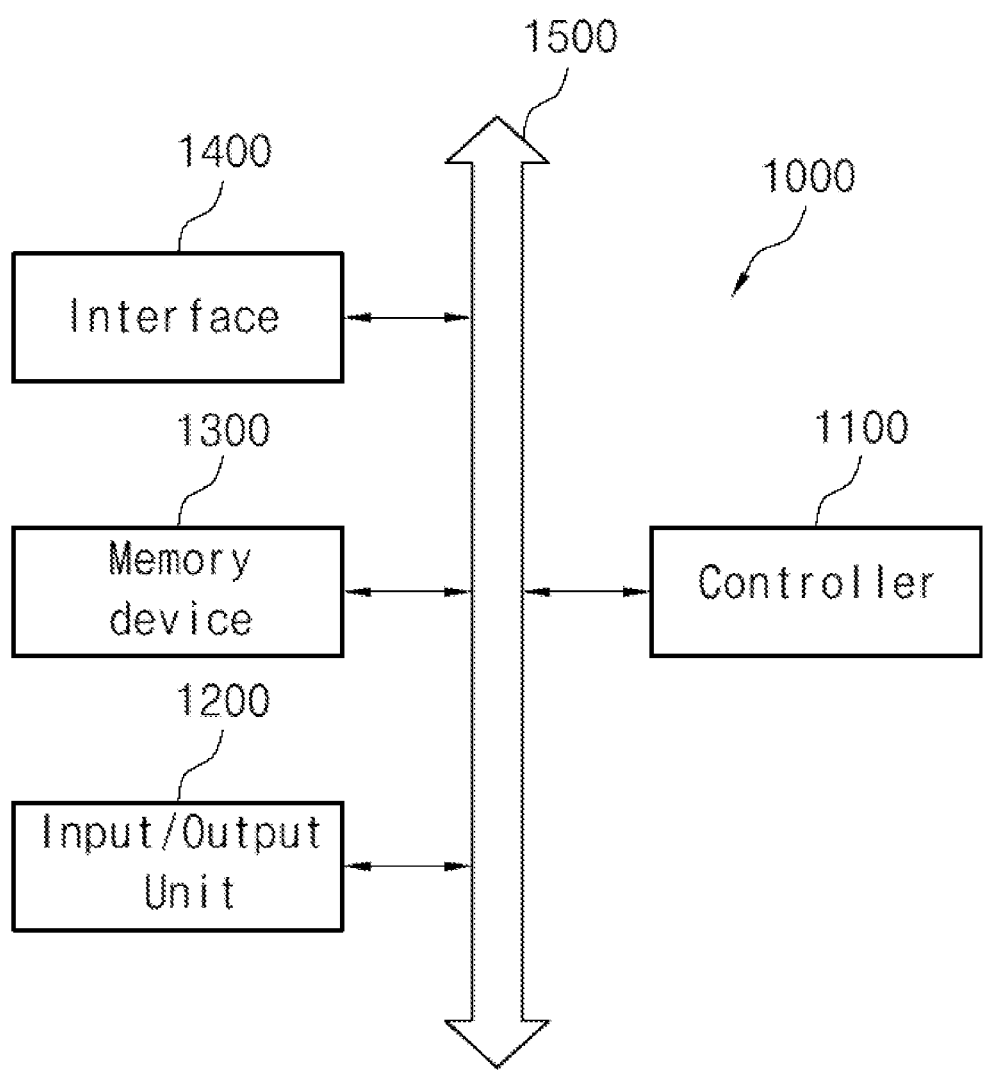
FIG. 8 is a block diagram illustrating an example of an electronic system including the memory modules in accordance with various embodiments.

Referring to FIG. 8, an electronic system 1000 may include the memory modules in accordance with various embodiments. For instance, the electronic system 1000 may include a controller 1100, an input/output unit 1200, and a memory device 1300. The controller 1100, the input/output unit 1200, and the memory device 1300 may be coupled to one another through a system bus 1500.

For example, the controller 1100 may include one or more of a microprocessor, a digital signal processor, a microcontroller, and logic devices capable of performing similar functions to these components. The input/output unit 1200 may include one or more of a keypad, a keyboard, a display device, and so forth.

The memory device 1300 may store data and/or commands to be executed by the controller 1100. The memory device 1300 may include the memory modules in accordance with various embodiments.

The electronic system 1000 may further include an interface 1400 for transmitting data to a communication network or receiving data from the communication network. The interface 1400 may be a wired or wireless type. For example, the interface 1400 may include an antenna or a wired/wireless transceiver.

Although not shown, the electronic system 1000 may further include an application chipset, a camera image processor (CIP), and so forth.

The electronic system 1000 may be realized as a mobile system, a personal computer, a computer for an industrial use, or a logic system performing various functions. For example, the mobile system may be a personal digital assistant (PDA), a portable computer, a web tablet, a mobile phone, a smart phone, a wireless phone, a laptop computer, a memory card, a digital music system, or an information transmission/reception system.

In a case where the electronic system 1000 is an equipment capable of performing wireless communication, the electronic system 1000 may be used in a communication system such as Code Division Multiple Access (CDMA), Global System for Mobile communication (GSM), North American Digital Cellular (NADC), Enhanced-Time Division Multiple Access (E-TDMA), Wideband Code Division Multiple Access (WCDMA), CDMA2000, Long Term Evolution (LTE) and Wireless Broadband Internet (Wibro).

While various embodiments have been described above, it will be understood to those skilled in the art that the embodiments described are by way of example only. Accordingly, the memory module including batteries described herein should not be limited based on the described embodiments.

What is claimed is:

1. A memory module comprising:
a first circuit board having a plurality of electrical contacts on an edge of said first circuit board, the plurality of electrical contacts being configured to mate with and engage a mating connector attached to a second and different circuit board;
a controller attached to the first circuit board;
a first memory attached to the first circuit board and configured to be enabled in response to one or more of first control signals provided by the controller;
a second memory attached to the first circuit board and configured to be enabled in response to one or more of second control signals provided by the controller;
a register clock driver attached to the first circuit board;
a super capacitor attached to the first circuit board, the supercapacitor being configured to be selectively coupled to the controller, the super capacitor being sized, shaped and arranged to provide electrical energy to the controller when the supercapacitor is coupled to the controller; and a heat sink interposed between one surface of the first memory and one surface of the supercapacitor leaving exposed the top and side surfaces of the supercapacitor, wherein engagement of the electrical contacts in the connector electrically couple components on the first circuit board to components on the second circuit board which lacks a supercapacitor or a battery for supplying back-up or standby electrical energy to components attached to the first circuit board during a power outage.

2. The memory module according to claim 1, wherein the supercapacitor is configured to enable the memory module to be persistent in the event of a power outage.

3. The memory module according to claim 1, wherein the supercapacitor is configured to provide power to the second memory to be responded to one or more of the second control signals from the controller in the event of a power outage.

4. The memory module according to claim 1, wherein the supercapacitor is configured to sustain power temporarily to the first memory during a power outage.

5. The memory module according to claim 1, wherein the controller is configured to enable data transmission from the first memory to the second memory to save data in a power outage.

6. The memory module according to claim 1, wherein the controller is configured to enable data transmission to restore data in the first memory from the second memory after having recovered from a power outage.

7. The memory module according to claim 1, wherein the heat sink is configured to contact with the first memory.

8. The memory module according to claim 1, wherein the heat sink is configured to contact with the second memory.

9. The memory module according to claim 1, further comprising: a switch configured to selectively turn on an electrical path to the first memory in response to a third control signal from the controller.

10. The memory module according to claim 1, wherein the first memory and the supercapacitor are mounted over both the first and second surfaces of the module.

11. The memory module according to claim 1, wherein the first memory comprise a volatile memory.

12. The memory module according to claim 1, wherein the second memory comprise a non-volatile memory.

13. A memory module comprising:
a first circuit board comprising:
  a controller;
  a first memory configured to be enabled in response to one or more of first control signals provided by the controller;
  a second memory configured to be enabled in response to one or more of second control signals provided by the controller;
  a third memory configured to be enabled in response to one or more of the first control signals provided by the controller;
  a first switch and a second switch configured to be enabled in response to one or more the first control signals;
  a supercapacitor configured to electrically selectively be coupled to the controller during a power failure; and
  a heat sink interposed between one surface of the first memory and one surface of the supercapacitor leaving exposed the top and side surfaces of the supercapacitor,
  wherein the controller, the first memory, the second memory, and the third memory, receive stand-by electrical energy from the supercapacitor during a power failure, but not from a second and different circuit board to which the first circuit board is connected.

14. The memory module according to claim 13, wherein the supercapacitor is configured to enable the first memory to be persistent in the event of a power outage except the third memory.

15. The memory module according to claim 13, wherein the supercapacitor is configured to sustain power temporarily to the first memory to be actively operated and to the third memory to be operated with less power consumption during a power outage.

16. The memory module according to claim 13, wherein the controller is configured to enable data transmission from the first memory to the second memory to save data after enabling data transmission from the third memory to the second memory in a power outage.

17. A memory module according to claim 13, wherein the heat sink is configured to contact with the first memory and the second memory.

18. The memory module according to claim 13, wherein the first switch is configured to selectively turn on an electrical path to the first memory in response to one or more of the first control signals from the controller while the second switch keeping unchanged an electrical path to the third memory.

19. The memory module according to claim 13, wherein the first memory and the third memory comprise a volatile memory.

20. The memory module according to claim 13, wherein the second memory comprise a non-volatile memory.

21. An electronic system comprising:
a main system board;
a memory module coupled to the main system board and comprising;
  a controller;
  a first memory configured to be enabled in response to one or more of first control signals provided by the controller;
  a second memory configured to be enabled in response to one or more of second controls signals provided by the controller;
  a register clock driver;
  a supercapacitor configured to electrically selectively be coupled to the controller, and
  an interface; and
  a heat sink interposed between one surface of the first memory and one surface of the supercapacitor leaving exposed the top and side surfaces of the supercapacitor,
  wherein the controller, the first memory, the second memory, the register clock driver, the supercapacitor and the interface are mounted over a single module substrate;
wherein the main system board does not have either a battery or a supercapacitor that provides stand-by electrical energy to the memory module or any of its components.

22. The electronic system according to claim 21, wherein the interface comprises a wireless transceiver.

23. The memory module according to claim 13, wherein the controller is configured to enable data transmission to restore data in the first memory and the third memory from the second memory after having recovered from a power outage.

* * * * *